(12) United States Patent
Takeuchi et al.

(10) Patent No.: US 6,396,196 B1
(45) Date of Patent: May 28, 2002

(54) PIEZOELECTRIC DEVICE

(75) Inventors: Yukihisa Takeuchi, Nishikamo-gun; Koji Kimura, Nagoya, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 08/488,455

(22) Filed: Jun. 7, 1995

Related U.S. Application Data

(63) Continuation of application No. 08/173,109, filed on Dec. 27, 1993, now abandoned.

(30) Foreign Application Priority Data

Dec. 26, 1992 (JP) ............................................. 4-358979

(51) Int. Cl.[7] .............................................. H01L 41/08
(52) U.S. Cl. ...................... 310/324; 310/328; 310/330; 310/331; 310/369
(58) Field of Search ................................ 310/330–332, 310/328, 369, 357–359, 324, 366

(56) References Cited

U.S. PATENT DOCUMENTS

| | | | | |
|---|---|---|---|---|
| 2,549,872 A | * | 4/1951 | Willard | 310/369 X |
| 2,756,353 A | * | 7/1956 | Samsel | 310/330 |
| 3,387,607 A | * | 6/1968 | Gauthier et al. | 310/335 X |
| 3,433,461 A | * | 3/1969 | Scarpa | 310/335 X |
| 3,509,387 A | | 4/1970 | Thorn et al. | 310/328 X |
| 3,588,552 A | * | 6/1971 | Schafft | 310/369 X |
| 3,940,637 A | | 2/1976 | Ohigashi et al. | 310/8.5 |
| 4,068,144 A | * | 1/1978 | Toye | 310/328 X |
| 4,308,547 A | * | 12/1981 | Lovelady et al. | 310/366 X |
| 4,625,221 A | * | 11/1986 | Mizuno et al. | 310/317 X |
| 4,635,079 A | * | 1/1987 | Hubbard | 310/371 X |
| 4,680,595 A | * | 7/1987 | Cruz-Uribe et al. | 346/140 R |
| 4,769,570 A | | 9/1988 | Yokoyama et al. | 310/332 |
| 5,089,455 A | | 2/1992 | Ketcham et al. | 501/104 |
| 5,126,615 A | | 6/1992 | Takeuchi et al. | 310/330 |
| 5,210,455 A | | 5/1993 | Takeuchi et al. | 310/328 |

FOREIGN PATENT DOCUMENTS

| | | | |
|---|---|---|---|
| EP | 0455342 | 11/1991 | ........... H01L/41/09 |
| FR | 2570223 | 3/1986 | |
| GB | 2161647 | 1/1986 | |
| JP | 58-196069 | 11/1983 | |
| JP | 61-253873 | 11/1986 | |
| JP | 62-213399 | 9/1987 | |
| JP | 63-285983 | 11/1988 | |
| JP | 1282878 | 11/1989 | |

OTHER PUBLICATIONS

Patent Abstracts of Japan, vol. 009, No. 266 (E–352) Oct. 23, 1985 & JP–A–60 111 600 (Mitsubishi Kogyo Cement KK) Jun. 18, 1985.

* cited by examiner

*Primary Examiner*—Mark O. Budd
(74) *Attorney, Agent, or Firm*—Burr & Brown

(57) ABSTRACT

A piezoelectric device (1) includes an at least locally thin-walled ceramic substrate (2) and at least one piezoelectric transducer (3) formed on the thin-walled region (2a) of the substrate. The transducer (3) is film-shaped and has a convex shape to protrude toward the substrate (2).

10 Claims, 5 Drawing Sheets

FIG_1

FIG_4
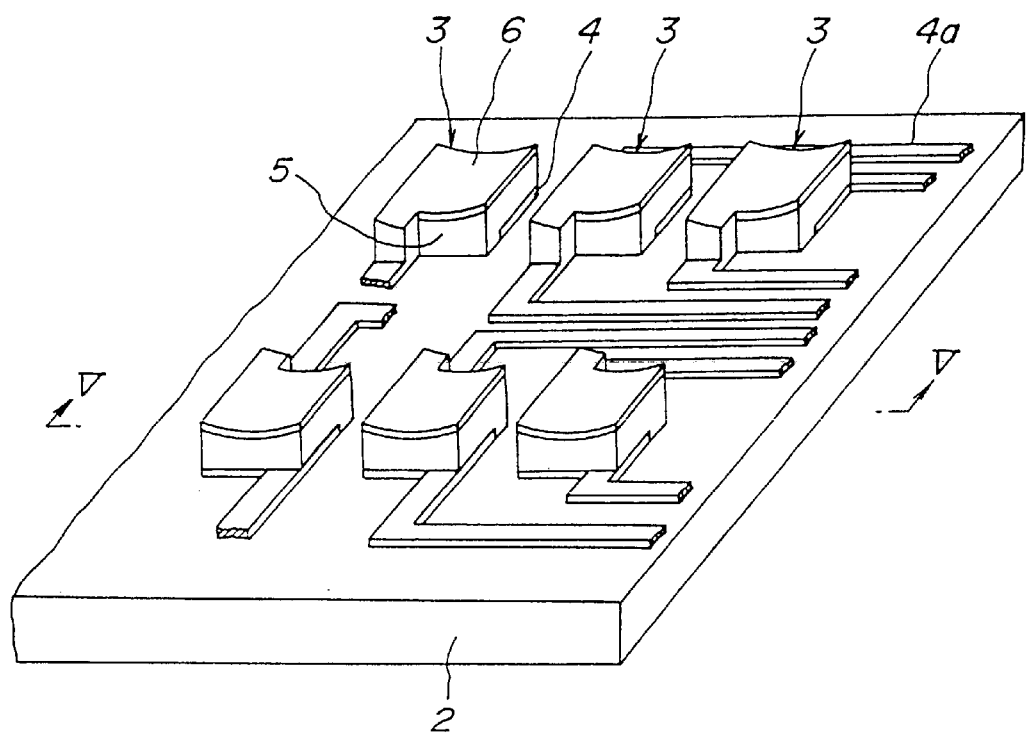
FIG_5
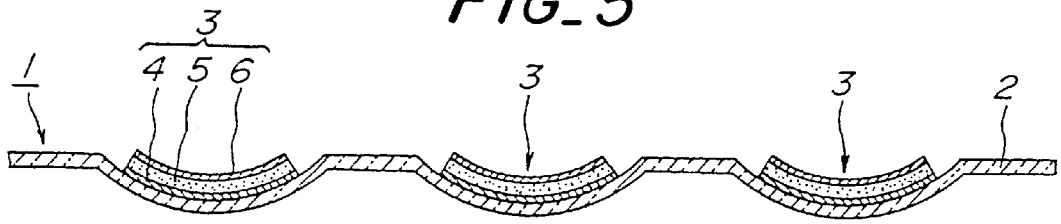

PIEZOELECTRIC DEVICE

This is a Continuation of application Ser. No. 08/173,109 filed Dec. 27, 1993, now abondoned.

BACKGROUND OF THE INVENTION

1. Field of the Invention

The present invention relates to a piezoelectric device for converting an input mechanical energy into an output electrical energy, and vice versa.

More particularly, the present invention pertains to a piezoelectric device which comprises a thin ceramic substrate and a piezoelectric transducer formed on the substrate, wherein the transducer includes a piezoelectric layer arranged between two electrode layers.

2. Description of the Related Art

As generally known in the art, a piezoelectric device is typically used to convert an input mechanical stress into an output electric charge (voltage) and also to convert an input electric voltage into an output mechanical distortion. In the latter case, the device is sometimes called as an electrostrictive device. The term "piezoelectric device" as used herein is to be interpreted in its broadest sense, as encompassing an electrostrictive device as well. Similarly, the term "piezoelectric material" as used herein is to be interpreted in its broadest sense as encompassing an electrostrictive material as well. When the output of the piezoelectric device is a mechanical distortion, such distortion can be used to generate mechanical force, displacement or vibration.

Conventionally, piezoelectric devices have been used for various purposes. For example, in the field of optics or precision engineering, there is a progressive demand for actuators capable of adjusting lengths and/or positions of the optical path on a sub-micron order, or for sensors capable of detecting a fine mechanical displacement. There have been various proposals directed to such demands in conjunction with application of piezoelectric devices. Specifically, there is known a unimorph-type piezoelectric device which undergoes bending or flexural deformation upon application of an input electrical voltage, and which can be used for ink jet printing heads, acoustic radiators (i.e., loudspeakers and the like), vibrators, etc. The unimorph-type piezoelectric device can also be used to convert a bending or flexural deformation into an electrical voltage, e.g., as a microphone or sensor.

With reference, for example, to ink jet printing heads including a unimorph-type piezoelectric device, in view of customer's or end users' requirement for a high-quality and high-speed printing performance, it is desirable to realize an improved piezoelectric device which is of a minimized size and which operates at a low driving voltage and yet provides a satisfactory response characteristic. In the unimorph-type piezoelectric devices, it is highly desirable to reduce the thickness of the substrate so as to assure a sufficient amount of flexural displacement of the substrate or to enable generation of a sufficient potential level. On the other hand, however, a reduced thickness of the substrate often results in insufficient mechanical strength or rigidity of the substrate. Moreover, a known piezoelectric transducer formed on the substrate of the unimorph-type piezoelectric device is comprised of plate-like members, e.g., piezoelectric plate and electrode plates, which are typically bonded to the substrate by means of adhesives. Such a structure may give rise to disadvantages in that, due to deterioration with time of the adhesion strength, it becomes difficult to effectively transfer to the substrate a mechanical distortion which has been generated by the piezoelectric plate.

DISCLOSURE OF THE INVENTION

It is a primary object of the present invention to provide an improved piezoelectric device having a relatively high mechanical strength, which is capable of generating a relatively high degree of mechanical distortion upon application of a relatively low electrical voltage, which provides satisfactory reliability and response characteristic, and which is compact and thus suitable for a high density integration.

Another object of the present invention is to provide an improved piezoelectric device in which the piezoelectric transducer is maintained stably and firmly bonded to the substrate, thereby allowing a mechanical distortion to be effectively transferred from the transducer to the substrate.

According to the present invention, there is provided a piezoelectric device which comprises an at least locally thin-walled ceramic substrate and at least one piezoelectric transducer formed on the substrate. The transducer includes a piezoelectric layer arranged between two electrode layers. The transducer is in the form of a film which may be formed by a film-formation process known, per se. The film has a convex shape and protrudes toward the ceramic substrate.

With the above-mentioned arrangement of the present invention, the transducer having a convex shape protrudes toward the substrate. The protrusion is in a direction in which it is caused to displace during a normal operation of the device, thereby facilitating the displacement of the transducer even at a low input voltage level. Furthermore, the surface curvature of the transducer provides a relatively high mechanical strength or rigidity suppressing displacement of the transducer in a direction away from the substrate.

As will be fully described hereinafter, the convex shape of the transducer and a corresponding curvature of the substrate is advantageously formed during a heat treatment or sintering of the piezoelectric film layer, due to a predetermined relationship of the firing shrinkage and the coefficient of linear expansion of the piezoelectric film layer relative to the coefficient of linear expansion of the ceramic substrate. Thus, preferably, the ceramic substrate comprises a material having a coefficient of linear expansion within a range of $60 \times 10^{-7}/°$ C. to $120 \times 10^{-7}/°$ C.

Advantageously, the material for the ceramic substrate having the coefficient of linear expansion within the above-mentioned range comprises zirconium oxide as a main component, having a crystal phase that is completely or partially stabilized preferably by the addition of at least one member selected from a group consisting of yttrium oxide, cerium oxide, magnesium oxide and calcium oxide. Such a substrate material exhibits high mechanical strength, high fracture toughness and low chemical reactivity with the piezoelectric material during heat treatment, even when the substrate has a small thickness.

The average crystal particle size of the ceramic substrate is preferably 5 $\mu$m or less, more preferably 1 $\mu$m or less, in view of the desired mechanical strength of the substrate. The thickness of the thin-walled ceramic substrate as a whole, or the thin-walled region of the ceramic substrate is preferably 50 $\mu$m or less, more preferably 30 $\mu$m or less, and further more preferably 10 $\mu$m or less. The thickness of the piezoelectric transducer is preferably 100 $\mu$m or less, and more preferably 50 $\mu$m or less.

Since, according to the present invention, the piezoelectric transducer is formed as a film on the thin-walled ceramic substrate, or the thin-walled region of the ceramic substrate, it is possible to generate a sufficient amount of displacement even at a relatively low operational voltage. At the same time, it is possible to achieve an excellent response characteristic and to generate a large force or high potential. Moreover, formation of the transducer by a film formation process makes it readily possible to provide the device with a number of piezoelectric transducers on the same substrate without using adhesives, thereby enabling a high density integration of the device.

BRIEF DESCRIPTION OF THE DRAWINGS

The present invention will be explained in further detail, by referring to the accompanying drawings in which:

FIG. 4 is a perspective view showing a third embodiment of the piezoelectric device according to the present invention, including a plurality of piezoelectric transducers on a substrate;

FIG. 5 is a sectional view taken along the line V—V in FIG. 4;

Throughout the entire figures, same reference numerals are used to denote same or equivalent elements.

DETAILED DESCRIPTION OF THE PREFERRED EMBODIMENTS

Figure 1:
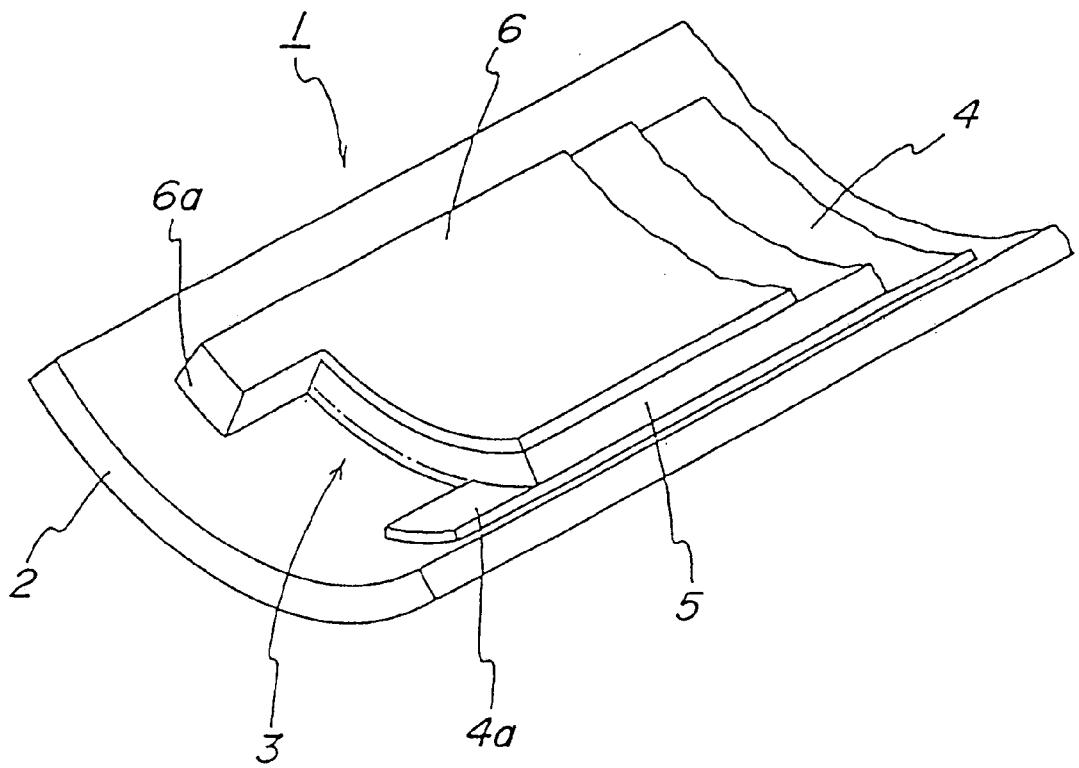
FIG. 1 is a perspective view illustrating a first embodiment of the piezoelectric device according to the present invention.

Referring now to FIG. 1, there is shown a basic embodiment of the piezoelectric device according to the present invention, which is denoted as a whole by reference numeral 1. The piezoelectric device 1 includes a thin ceramic substrate 2 and a piezoelectric transducer 3 on the substrate 2. The piezoelectric transducer 3 has been formed integrally with the substrate 2, by sequentially laminating a first electrode layer 4, a film-shaped piezoelectric layer 5 and a second electrode layer 6, by using an ordinary film-formation process to be described hereinafter. The piezoelectric transducer 3 has a concave shape so that its center portion protrudes toward the substrate 2. The electrode layers 4 and 6 have respective end regions which locally extend beyond the film-shaped piezoelectric layer 5 to form leads 4a, 6a for applying a voltage between the respective electrode layers 4, 6. The leads 4a, 6a of the electrode layers 4, 6 are supported by the substrate 2. In this connection, attention has to be paid regarding the arrangement of the electrode layer 4 on the lower side and the leads 6a of the electrode layer 6 on the upper side, so as to prevent occurrence of undesirable short-circuit between the lead 6a and the electrode layer 4. When an operational voltage is applied between the electrode layers 4, 6, an electric field is generated and acts on the piezoelectric layer 5 to induce a flexural motion or to generate a force in a direction perpendicular to the general surface of the substrate 3, as a result of the transverse effect of the electric field-induced distortion.

As mentioned above, the piezoelectric transducer 3 has such a convex shape as to protrude toward the substrate 2. Thus, in comparison to an ordinary flat piezoelectric transducer, the curved transducer 3 in operation can be more effectively displaced toward the substrate 2. This makes it possible to achieve a relatively large amount of displacement at a low voltage and to thereby realize a higher conversion efficiency. It is further possible to suppress the displacement of the transducer 3 in the opposite direction, i.e., in a direction away from the substrate 2. Furthermore, due to the corresponding curvature of the substrate 2, it is possible to provide an improved rigidity of the thin substrate 2 even when it is used in a cantilever manner.

Figure 2:
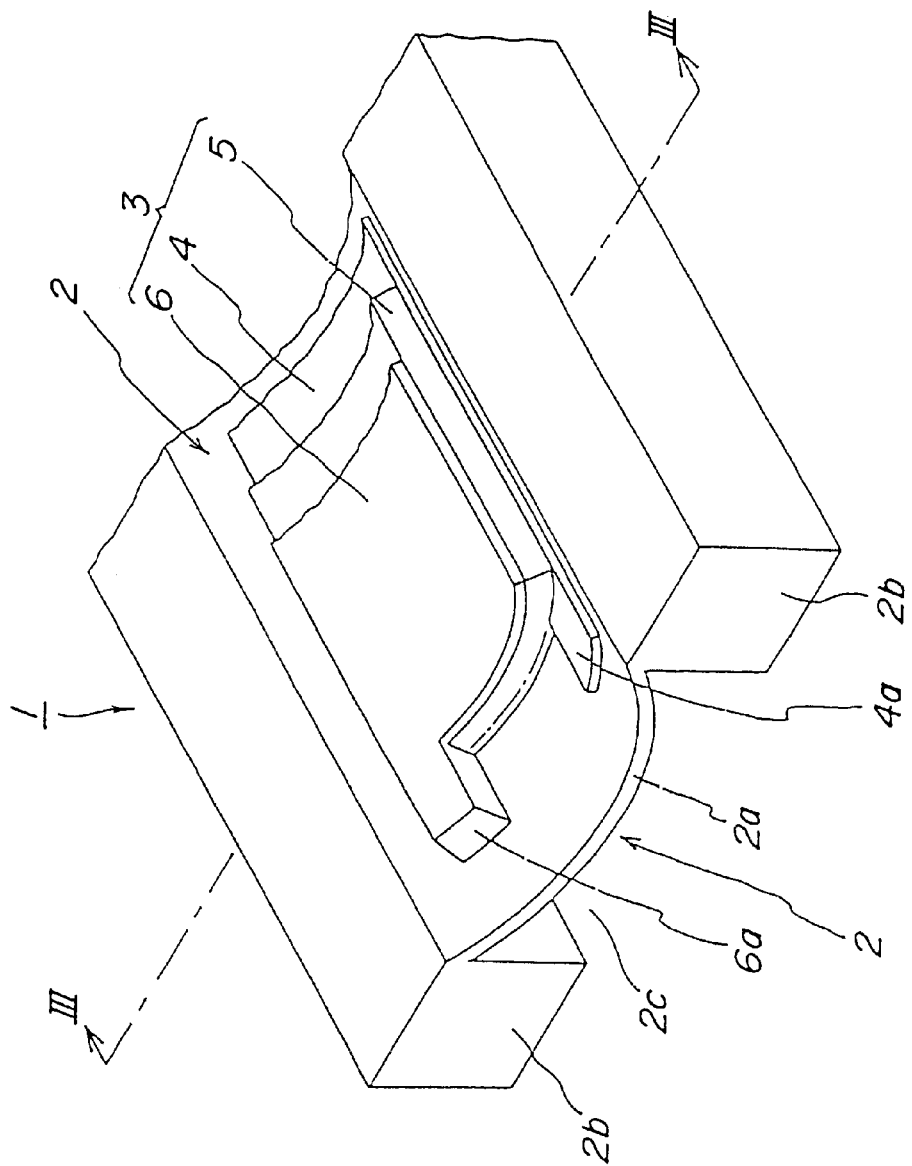
FIG. 2 is a perspective view illustrating a second embodiment of the piezoelectric device according to the present invention.
Figure 3:
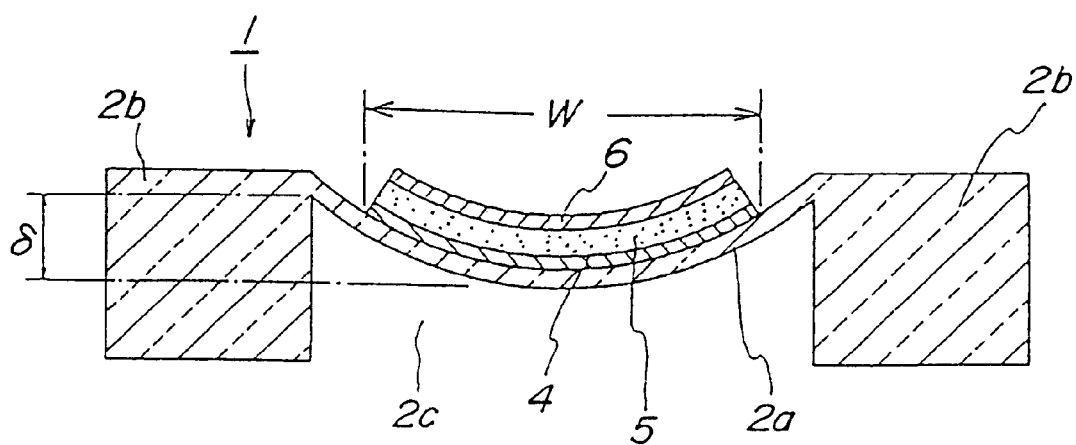
FIG. 3 is a sectional view taken along the line III—III in FIG. 2.

Another embodiment of the piezoelectric device 1 according to the present invention is shown in FIGS. 2 and 3, which is essentially same as the previous embodiment but differs therefrom in that the ceramic substrate 2 has a thin-walled region 2a and thick-walled edges 2b on both sides of the thin-walled region 2a. These edges 2b define a cavity 2c on the rear side of the substrate 2. In this case, the piezoelectric transducer 3 is formed on the thin-walled region 2a of the substrate 2, and has a concave shape so as to protrude toward the transducer 3. Assuming that the transducer 3 is of a generally rectangular configuration having shorter edges of which the width is W as shown in FIG. 3, the amount δ of the protrusion of the piezoelectric transducer 3 may be determined in accordance with the width W. In this case, the protrusion amount δ is preferably about 1–20% of the width W, more preferably about 3–10% of the width W.

Still another embodiment of the piezoelectric device 1 according to the present invention is shown in FIGS. 4 and 5, which is essentially same as the previous embodiment of FIG. 1 in that the ceramic substrate 2 as a whole is thin-walled, but differs therefrom in that the ceramic substrate 2 is relatively large and a predetermined number of piezoelectric transducers 3 (e.g., 96 in number) are formed on the thin-walled ceramic substrate 2 and arranged with respect to each other at a predetermined pitch. It should be noted that the convex shape of the electrode layer 6 on the lower side is not visible in FIG. 4. This type of arrangement is particularly suitable for ink jet printing heads which serve to discharge ink for printing characters or codes by a predetermined number of printed dots.

Figure 6:
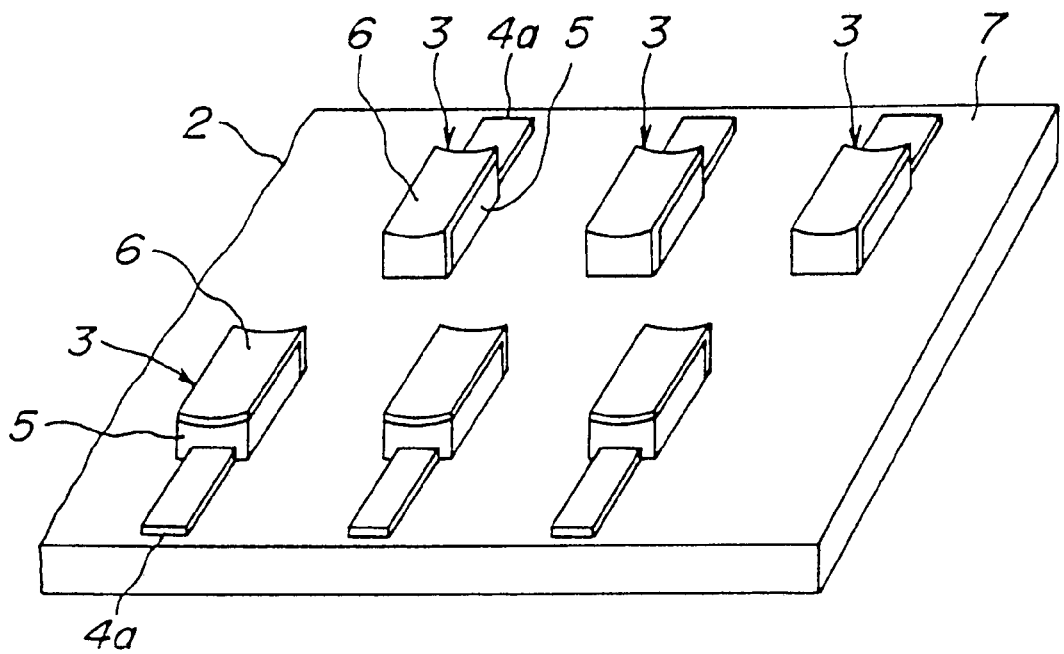
FIG. 6 is a perspective view illustrating a fourth embodiment of the piezoelectric device according to the present invention, including a plurality of piezoelectric transducers on a substrate.
Figure 7:
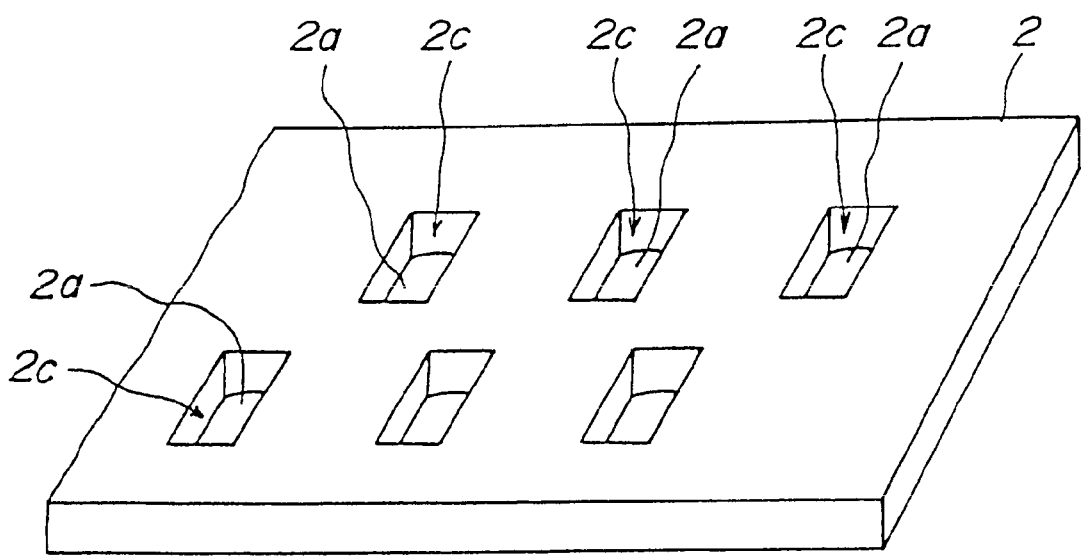
FIG. 7 is a perspective view illustrating the rear side of the piezoelectric device of FIG. 6.

Still another embodiment of the piezoelectric device 1 according to the present invention is shown in FIGS. 6 and 7, which is essentially the same as the previous embodiment of FIGS. 2 and 3 but slightly differs therefrom in that the ceramic substrate 2 is relatively large and a predetermined number of piezoelectric transducers 3 (e.g., 96 in number) are formed on the thin-walled regions 2a of the substrate 2 and arranged with respect to each other at a predetermined pitch in a zig-zag manner. This type of arrangement is also suitable for ink jet printing heads. As can be appreciated from FIG. 7, the substrate 2 is formed in its rear surface with a predetermined number of cavities 2c on the rear side of the thin-walled regions 2a corresponding to the piezoelectric transducers 3, so that the cavities 2c are arranged at a predetermined pitch in a zigzag manner. These cavities 2c serve to accommodate ink to be discharged for printing characters or codes. Thus, when selected transducers 3 are caused to displace toward the substrate 2, the volume of the relevant cavities 2c is decreased to discharge the ink. During the discharge of ink, the thin-walled region 2a is applied with a reaction force generated by the discharge pressure. However, each thin-walled region 2a has a concave shape which is effective to minimize the deflection of the substrate 2 toward the transducer 3, to thereby minimize the pressure loss.

In any of the embodiments described above, the ceramic substrate 2 formed with at least one piezoelectric transducer may comprise an insulating or dielectric ceramic material having a high mechanical strength, e.g., an appropriate oxide series or non-oxide series ceramic material, provided that it can be readily integrated with the piezoelectric transducer by a heat treatment at 900° C. to 1400° C. as will be described hereinafter, without using adhesives or bonding agent. In this connection, it is preferable to use a ceramic material having a coefficient of linear expansion within a range of $60 \times 10^{-7}/°$ C. to $120 \times 10^{-7}/°$ C., more preferably $80 \times 10^{-7}/°$ C. to $110 \times 10^{-7}/°$ C. This is because the ceramic materials having such a coefficient of linear expansion can be suitably shaped into the desired concave shape during the heat treatment or sintering of the piezoelectric material. Advantageously, the ceramic substrate material comprises zirconium oxide as a main component, having a crystal phase that is completely or partially stabilized preferably by the addition of at least one compound selected from a group consisting of yttrium oxide, cerium oxide, magnesium oxide and calcium oxide. Such a ceramic material is advantageous in that it provides high mechanical strength and fracture toughness even when the substrate has a small thickness, is subjected to a relatively small stress during the heat treatment of the piezoelectric material in the film-formation process, and has a low reactivity with the piezoelectric material. In order to realize a thin ceramic substrate having a sufficient mechanical strength, the ceramic substrate has an average crystal particle size which is preferably within a range of 5 $\mu$m or less, more preferably 1 $\mu$m or less.

The amount of additives required for partially or completely stabilizing the zirconium oxide as described above may be 1–30 mol % for yttrium oxide, 6–50 mol % for cerium oxide, and 5–40 mol % for the magnesium oxide and calcium oxide. As for yttrium oxide in particular, the amount is preferably 2–7 mol %, more preferably 2–4 mol %, because the zirconium oxide added with the yttrium oxide of such amount has a partially stabilized crystal phase and thus exhibits particularly excellent substrate characteristics.

The ceramic substrate may have an overall thin plate-like shape as shown in FIGS. 1, 4 and 5, or may be formed with at least one local cavity 2c having a bottom surface which defines the thin-walled region 2a for forming the piezoelectric transducer 3 thereon, as shown in FIGS. 2, 3, 6 and 7. The latter type of the ceramic substrate is often preferable since only those regions corresponding to the piezoelectric transducers are thin-walled, and it is thus readily possible to preserve the desired high mechanical strength of the substrate as a whole. Furthermore, particularly when a plurality of piezoelectric transducers are formed on a substrate, adjacent transducers in operation can be effectively prevented from undesirable interference with each other due to the presence of relatively rigid thick-walled regions between adjacent thin-walled regions. The cavity formed in the substrate for defining the thin-walled region has dimensions which are preferably determined such that the length of the cavity is 2–20 times larger then its width. Furthermore, for assuring a sufficient amount of displacement or force to be generated by the piezoelectric transducer, the transducer is formed on the thin-walled region of the substrate over an area which preferably corresponds to 50–95% of the width of the cavity.

As for the thin-walled ceramic substrate or the thin-walled region of the ceramic substrate, in order to provide an improved high-speed response characteristic and a high conversion efficiency of the piezoelectric transducer, the thickness is preferably 50 $\mu$m or less, more preferably 30 $\mu$m or less, and further more preferably 10 $\mu$m or less.

The green sheet for the ceramic substrate may be subjected to a sintering at a temperature of 1,000° C. to 1,800° C. prior to formation of the piezoelectric transducer. Alternatively, the green sheet for the ceramic substrate may be subjected to a suitable film-formation process to form the piezoelectric transducer and then sintered. Formation of the piezoelectric transducer on the previously sintered ceramic substrate is often desirable in view of minimization of warps in the final product and improvement in the dimensional accuracy of the piezoelectric transducer. A preferred method of forming the ceramic substrate with at least one cavity is to prepare a first green sheet having a desired thickness and formed with at least one recess by using a suitable mold or machining process, such as ultrasonic machining. A second, relatively thin green sheet is further prepared to have a thickness which corresponds to that of the thin-walled region of the substrate. The second green sheet is superimposed on the first green sheet under a predetermined temperature/pressure condition, and then fired and integrated with each other. The material for the ceramic substrate may contain a sintering aid, such as clay or the like. In this case, it is desirable to adjust the composition and amount of the sintering aid so that the sintered substrate as a whole or at least the thin-walled region of the sintered substrate does not contain silicone oxide ($SiO$, $SiO_2$) in an amount of 1% or more by weight. This is because an excessive amount of silicone oxide often results in undesirable reaction of the substrate material with the piezoelectric material during the heat treatment, making it difficult to control the composition of the piezoelectric material.

The surface roughness Ra of the ceramic substrate which has been formed as explained above is controlled to be within a range of 0.03–0.9 $\mu$m, so that the substrate permits satisfactory operational characteristics of the piezoelectric transducer formed thereon. Namely, the distortion or stress occurring in the piezoelectric transducer can be effectively transmitted to the substrate having the above-mentioned range of the surface roughness Ra, and vice versa. Such control of the surface roughness is also effective to assure a high mechanical strength of the relatively thin substrate.

The piezoelectric transducer 3 on the ceramic substrate 2 comprising the electrode layers 4, 6 and the piezoelectric layer 5 may be formed by a suitable film-formation process known, per se. That is to say, the film-formation process which may be applied to form the piezoelectric transducer of the device according to the present invention includes a thick-film formation process such as screen printing, spraying, dipping or coating, and a thin-film formation process such as ion beam method, sputtering, vacuum vapor deposition, chemical vapor deposition (CVD), ion plating or other plating method. In particular, the thick-film formation process can be advantageously applied to form a film-like piezoelectric layer. This is because the thick-film formation process makes it readily possible to form a film on the ceramic substrate by using a paste or slurry whose major component is powder of piezoelectric ceramic material. In this case, when the powder of piezoelectric ceramic material has an average particle size within a range of 0.01 $\mu$m to 5 $\mu$m, preferably 0.05 $\mu$m to 3 $\mu$m, it is readily possible to realize excellent operational characteristics of the piezoelectric device. While the pattern of such a film may be formed by the screen printing method or photolithography method, the pattern may also be formed be removing unnecessary regions of the film by laser cutting, slicing, ultrasonic machining or other suitable machining process.

The present invention is not limited to the specific construction, shape and/or pattern of the piezoelectric transducer illustrated in the drawings. For example, depending upon the utility of the piezoelectric device, the transducer may have triangular, rectangular or other polygonal shape, circular, elliptical or annular shape, comb- or lattice-like pattern, or any combination of these shapes and/or patterns.

The electrode layers and the piezoelectric layer formed on the ceramic substrate by a selected method as explained above may be either heat-treated in different steps for integration with the substrate each time a layer has been formed on the substrate, or simultaneously heat-treated in a single step for integration with the substrate after all the layers have been formed into a laminated structure on the substrate. It should be noted in this connection that when a film-formation process is used to form the film layers on the substrate, it is not always a prerequisite condition to carry out the heat treatment for integrating the film layers with the substrate. Thus, for example, in order to provide an enhanced insulation between the two electrode layers 4, 6 on both sides of the piezoelectric film layer 5, there may be instances wherein a coating of insulation resin or the like is provided on the periphery of the device, before formation of the electrode layer 6 on the upper side. In such a case, the electrode layer on the upper side is formed by a process which does not require heat treatment.

The heat treatment temperature suitable for integrating the film layers and the substrate and realizing a convex shape of the piezoelectric transducer is generally within a range of 900–1,400° C. preferably 1,000–1,400° C. During the heat treatment of the piezoelectric film layer 5, in order to stabilize the composition of the piezoelectric material and avoid undesirable change in the composition in a high temperature condition, the heat treatment is preferably performed while controlling the atmosphere by heating with the vaporization source of the piezoelectric material as well. It is also advantageous to use a method of firing the piezoelectric film layer while it is covered by a suitable cover member for preventing a direct exposure of the piezoelectric film layer to the firing atmosphere. In this case, the cover member consists preferably of a material which is similar to the ceramic substrate material.

The electrode layer 4 of the piezoelectric transducer 3 may be formed of any electrically conductive material which can withstand the oxidizing firing and the heat treatment atmosphere at a considerably high temperature condition as explained above. Thus, the electrode layers may be formed of a single metal, an alloy of metals, a mixture of metal or alloy with an electrically insulating ceramic material, or an electrically conductive ceramic material. However, it is preferable to use an electrode material whose major component is a noble metal having a high melting point, such as platinum, palladium, or rhodium, or an alloy such as silver-palladium, silver-platinum, platinum-palladium or the like. It is more preferable to use a cermet material of platinum and the ceramic material for the substrate, in particular a cermet material of platinum, the ceramic material for the substrate and the piezoelectric material for the piezoelectric film layer, in view of an improved adhesion of the electrode layers to the piezoelectric film layer and/or the ceramic substrate. As for additive materials to be added to the electrode material, use of glass should be avoided because glass tends to react with the piezoelectric material during the heat treatment thereby deteriorating the characteristics of the piezoelectric device. The amount of the substrate material to be added to the electrode material is preferably 5–30% by volume, and the amount of the piezoelectric material to be added to the electrode material is preferably 5–20% by volume. On the other hand, the electrode layer 6 may be composed of an ordinary electrically conductive material, such as Au, Ag, Cu, Cr, Ni, etc.

The electrode layers 4, 6 consisting of a conductive material as mentioned above may have a thickness of 20 μm or less, preferably 5 μm or less.

The piezoelectric layer may be formed of any piezoelectric material which exhibits a relatively large amount of electric field-induced strain or displacement when applied with a voltage, due to the converse or reverse piezoelectric effect, or electrostrictive effect. The piezoelectric material may be either a crystalline material or an amorphous material, and may be a semi-conductive material or a dielectric or ferroelectric ceramic material. Furthermore, the piezoelectric material may either require an initial polarization or poling treatment or may not require such treatment.

Preferably, however, the piezoelectric materials which can be used in the present invention have a composition whose major component is lead zirconate titanate (PZT), lead magnesium niobate (PMN), lead nickel niobate (PNN), lead manganese niobate, lead antimony stannate, lead zinc niobate, lead titanate, lead zirconate, or a mixture or solid solution thereof. Furthermore, the piezoelectric materials indicated above, whose major component is PZT or the like may be added with a suitable amount of additives comprising an oxide or compound of lanthanum, barium, niobium, zinc, cerium, cadmium, chromium cobalt, antimony, iron, yttrium, tantalum tungsten, nickel, manganese, lithium, strontium, calcium, and/or bismuth, so as to obtain a material such as PLZT. However, addition of glass should be avoided, since lead contained in the piezoelectric material such as PZT tends to react with glass, making it difficult to achieve a desired composition of the piezoelectric film layer, thereby causing undesirable fluctuation and deterioration of the operational characteristics of the piezoelectric device.

Among the piezoelectric materials indicated above, it is preferable to use a material of which the major component comprises a mixture of lead magnesium niobate, lead zirconate and lead titanate, or a mixture of lead nickel niobate, lead magnesium niobate, lead zirconate and lead titanate. It is particularly advantageous to use a piezoelectric material of which the major component comprises a mixture of lead magnesium niobate, lead zirconate and lead titanate. Such a piezoelectric material has a particularly low reactivity with the substrate material during the heat treatment, and is thus free from segregation of its components, whereby a desired composition or crystal structure can be readily obtained as a result of a suitable treatment for maintaining the composition. Moreover, such a piezoelectric material has a particularly high piezoelectric constant, and can be used as a material suitable for forming the piezoelectric film layer by the above-mentioned thick-film formation process such as screen printing, spraying, dipping, coating and the like. While such multi-component piezoelectric material has a piezoelectric characteristic which varies depending upon the composition of components, a three-component material component of lead magnesium niobate, lead zirconate and lead titanate, which can be suitably used in the invention, preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly advantageous to use a composition containing 15–50 mol % of lead magnesium niobate, 10–45 mol % of lead zirconate and 30–45 mol % of lead titanate.

The piezoelectric transducer comprising the electrode layers and the piezoelectric film layer described above generally has a thickness of 100 μm or less. To assure a relatively large amount of displacement at a relatively low voltage, the piezoelectric film layer has a thickness which is preferably 50 μm or less, more preferably within a range of 3–40 μm.

In order to confirm the advantageous functions of the present invention, specimens of the piezoelectric devices of a basic structure comprising a substrate having a thin-walled region of a thickness of 10 μm and formed with a cavity shown in FIG. 2 were prepared in the following manner. That is to say, the substrate material of each specimen is zirconium oxide which has been partially stabilized by yttrium oxide, while the piezoelectric material for forming the piezoelectric layer on the thin-walled region of the substrate is a mixture of lead magnesium niobate, lead zirconate and lead titanate. The specimen of the conventional device was prepared by adhering a plate of the piezoelectric material with a thickness of 30 μm with a conductive bonding agent on the thin-walled region. For the specimen of the device according to the present invention, a paste of the piezoelectric material was screen-printed and heat-treated at a temperature of 1,000° C. or more, to obtain a film of a thickness of 30 μm. The piezoelectric transducer in the device according to the present invention has a convex shape toward the substrate as a result of the heat treatment. On the other hand, the piezoelectric transducer in the conventional device has a flat shape. The electrode layer 6 has been formed by a film-formation process, by sputtering Cu/Cr. In this instance, the electrode layer 6 comprises two sub-layers, i.e., a Cr sub-layer formed in the first stage and a Cu sub-layer formed on the Cr sub-layer in the second stage. The thin-walled region has a dimension of 0.8 mm×3 mm. Tests were performed with respect to these specimens, the result of which is shown in Table 1 below. The normal deflection amount in Table 1 designates the deflection of the piezoelectric transducer achieved by applying a pressure of 10 kgf/cm$^2$ to the central portion of the transducer by means of a gauge head (probe) having a diameter of 0.3 mm. The rearward displacement amount in Table 1 designates the displacement of the piezoelectric transducer in a direction away from the substrate by applying an air pressure of 0.5 kgf/cm$^2$. The displacement amount (DC 30 V) in Table 1 designates the displacement of the piezoelectric transducer actually achieved by applying an operational voltage of DC 30 V to the piezoelectric transducer.

TABLE 1

| Type of Specimen | Normal Deflection | Rearward Displacement | Displacement At DC 30V |
|---|---|---|---|
| Conventional Device | 30 μm | 1.0 μm | 1.4 μm |
| Device of Invention | 60 μm | 0.6 μm | 2.0 μm |

As can be appreciated from Table 1 above, the piezoelectric device according to the present invention provides an excellent conversion efficiency which makes it possible to obtain a relatively large displacement of the piezoelectric transducer at a given operational voltage, as compared to the conventional device. The improvement in the conversion efficiency results from a convex shape of the piezoelectric transducer which protrudes toward the substrate, making it possible to achieve an increased displacement in a normal direction toward the substrate and to suppress the displacement in the opposite direction away from the substrate.

The present invention thus provides an improved piezoelectric device having a relatively high mechanical strength, which serves to generate a relatively high degree of displacement upon application of a relatively low operational voltage, which provides satisfactory reliability and response characteristic, and which is yet compact and suitable for high density integration.

While the present invention has been described with reference to some preferred embodiments, they were given by way of examples only. Of course various changes and modifications may be made without departing from the scope of the present invention as defined by the appended claims.

What is claimed is:

1. A piezoelectric device comprising:
   a ceramic substrate with at least one thin-walled region defining at least one recess within said substrate, said thin-walled region being curved into said recess; and
   at least one piezoelectric transducer formed on the concave side of said thin-walled region of the substrate, said piezoelectric transducer being in the form of a film and including a piezoelectric layer arranged between two electrode layers, said piezoelectric transducer being curved in the same direction as said thin-walled region.

2. A piezoelectric device as claimed in claim 1, wherein the coefficient of linear expansion of said ceramic substrate is selected such that said piezoelectric transducer and a corresponding portion of said thin-walled region are curved during a heat treatment of the piezoelectric transducer.

3. A piezoelectric device as claimed in claim 1, wherein the ceramic substrate comprises zirconium oxide as a main component, said zirconium oxide having a completely or partially stabilized crystal phase.

4. A piezoelectric device as claimed in claim 3, wherein said zirconium oxide has a crystal structure which is completely or partially stabilized by the addition of at least one member selected from the group consisting of yttrium oxide, cerium oxide, magnesium oxide and calcium oxide.

5. A piezoelectric device as claimed in claim 2, wherein the ceramic substrate has an average crystal particle size of 5 μm or less.

6. A piezoelectric device as claimed in claim 1, wherein said thin-walled region of the ceramic substrate has a thickness of 50 μm or less.

7. A piezoelectric device as claimed in claim 1, wherein the piezoelectric transducer has a thickness of 100 μm or less.

8. A piezoelectric device as claimed in claim 1, wherein the piezoelectric device is formed by a method comprising the steps of:
   forming a substantially flat ceramic substrate having at least one substantially flat thin-walled region;
   applying a piezoelectric film to said substantially flat thin-walled region; and
   sintering the substrate and piezoelectric film to provide the curved shape of said piezoelectric transducer and a corresponding curvature in said thin-walled region of said ceramic substrate.

9. A piezoelectric device as claimed in claim 1, wherein said piezoelectric transducer protrudes in the same direction as the transducer is displaced during operation of the piezoelectric device.

10. A piezoelectric device as claimed in claim 2, wherein the ceramic substrate comprises a material having a coefficient of linear expansion within a range of 60×10$^{-7}$/° C. to 120×10$^{-7}$/° C.

* * * * *